(12) United States Patent
Hudait et al.

(10) Patent No.: US 7,892,902 B1
(45) Date of Patent: Feb. 22, 2011

(54) GROUP III-V DEVICES WITH MULTIPLE SPACER LAYERS

(75) Inventors: Mantu K. Hudait, Blacksburg, VA (US); Marko Radosavljevic, Beaverton, OR (US); Ravi Pillarisetty, Portland, OR (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/653,999

(22) Filed: Dec. 22, 2009

(51) Int. Cl.
*H01L 21/338* (2006.01)

(52) U.S. Cl. .................. 438/172; 438/167; 257/194

(58) Field of Classification Search .................. 438/167, 438/172; 257/192, 194
See application file for complete search history.

(56) References Cited

U.S. PATENT DOCUMENTS

| | | | |
|---|---|---|---|
| 7,429,747 B2 | 9/2008 | Hudait et al. | |
| 7,494,911 B2 | 2/2009 | Hudait et al. | |
| 7,566,898 B2 | 7/2009 | Hudait et al. | |
| 7,573,059 B2 | 8/2009 | Hudait et al. | |
| 7,592,213 B2 | 9/2009 | Datta et al. | |
| 7,601,980 B2 | 10/2009 | Hudait et al. | |
| 2006/0267045 A1* | 11/2006 | Ogura et al. | 257/192 |
| 2007/0138565 A1 | 6/2007 | Datta et al. | |
| 2007/0238281 A1 | 10/2007 | Hudait et al. | |
| 2007/0264837 A1 | 11/2007 | Rachmady et al. | |
| 2008/0029756 A1 | 2/2008 | Hudait et al. | |
| 2008/0032478 A1 | 2/2008 | Hudait et al. | |
| 2008/0132081 A1 | 6/2008 | Shaheen et al. | |
| 2008/0142786 A1 | 6/2008 | Datta et al. | |
| 2008/0203381 A1 | 8/2008 | Hudait et al. | |
| 2009/0001350 A1 | 1/2009 | Hudait et al. | |
| 2009/0218596 A1 | 9/2009 | Hudait et al. | |
| 2009/0298266 A1 | 12/2009 | Hudait et al. | |
| 2009/0302350 A1 | 12/2009 | Datta et al. | |
| 2010/0163849 A1* | 7/2010 | Radosavlijevic et al. | 257/24 |

OTHER PUBLICATIONS

Dewey et al. "Quantum-Well-Based Semiconductor Devices" U.S. Appl. No. 12/632,498, filed Dec. 7, 2009, 34 pages.
Mukherjee et al. "Methods of Forming Low Interface Resistance Rare Earth Metal Contacts and Structures Formed Thereby" U.S. Appl. No. 12/317,180, filed Dec. 18, 2008, 25 pages.

* cited by examiner

*Primary Examiner*—Bradley K Smith
(74) *Attorney, Agent, or Firm*—Winkle, PLLC

(57) ABSTRACT

A group III-V material device has multiple spacer regions above a quantum well channel region. A high-k value gate dielectric is formed on an InGaAs spacer above the quantum well channel region while there are InAlAs spacer regions under contact regions.

20 Claims, 16 Drawing Sheets

| Upper Spacer Region 114 |
|---|
| Middle Spacer Region 112 |
| First Spacer Region 110 |
| Channel Region 108 |
| Lower Barrier Region 106 |
| Buffer Region 104 |
| Substrate 102 |

Figure 8

| Doped Region 116 |
|---|
| Upper Spacer Region 114 |
| Middle Spacer Region 112 |
| First Spacer Region 110 |
| Channel Region 108 |
| Lower Barrier Region 106 |
| Buffer Region 104 |
| Substrate 102 |

Figure 9

| Etch Stop Region 120 |
|---|
| Upper Barrier Region 118 |
| Doped Region 116 |
| Upper Spacer Region 114 |
| Middle Spacer Region 112 |
| First Spacer Region 110 |
| Channel Region 108 |
| Lower Barrier Region 106 |
| Buffer Region 104 |
| Substrate 102 |

Figure 11

| Contact Region 122 |
|---|
| Etch Stop Region 120 |
| Upper Barrier Region 118 |
| Doped Region 116 |
| Upper Spacer Region 114 |
| Middle Spacer Region 112 |
| First Spacer Region 110 |
| Channel Region 108 |
| Lower Barrier Region 106 |
| Buffer Region 104 |
| Substrate 102 |

Figure 12

| Contact Region 122 |
|---|
| Upper Barrier Region 118 |
| Doped Region 116 |
| Upper Spacer Region 114 |
| Middle Spacer Region 112 |
| First Spacer Region 110 |
| Channel Region 108 |
| Lower Barrier Region 106 |
| Buffer Region 104 |
| Substrate 102 |

Figure 17

| |
|---|
| Contact Region 122 |
| Etch Stop Region 120 |
| Upper Barrier Region 118 |
| Doped Region 116 |
| Upper Spacer Region 114 |
| First Spacer Region 110 |
| Channel Region 108 |
| Lower Barrier Region 106 |
| Buffer Region 104 |
| Substrate 102 |

Figure 19

GROUP III-V DEVICES WITH MULTIPLE SPACER LAYERS

BACKGROUND

Background of the Invention

Most integrated circuits today are based on silicon, a Group IV element of the Periodic Table. Compounds of Group III-V elements such as gallium arsenide (GaAs), indium antimonide (InSb), indium phosphide (InP), and indium gallium arsenide (InGaAs) are known to have far superior semiconductor properties than silicon, including higher electron mobility and saturation velocity. These materials may thus provide superior device performance.

BRIEF DESCRIPTION OF THE DRAWINGS

FIG. 8 is a cross sectional side view that illustrates an upper spacer region.

FIG. 9 is a cross sectional side view that illustrates a doped region.

FIG. 11 is a cross sectional side view that illustrates an etch stop region.

FIG. 12 is a cross sectional side view that illustrates a contact region.

FIGS. 17 and 18 are cross sectional side views that illustrate an alternative embodiment.

FIGS. 19 and 20 are cross sectional side views that illustrate another alternative embodiment.

DETAILED DESCRIPTION

In various embodiments, a group III-V material semiconductor device and its fabrication are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment that falls within the scope of the invention, but do not denote that they are necessarily present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
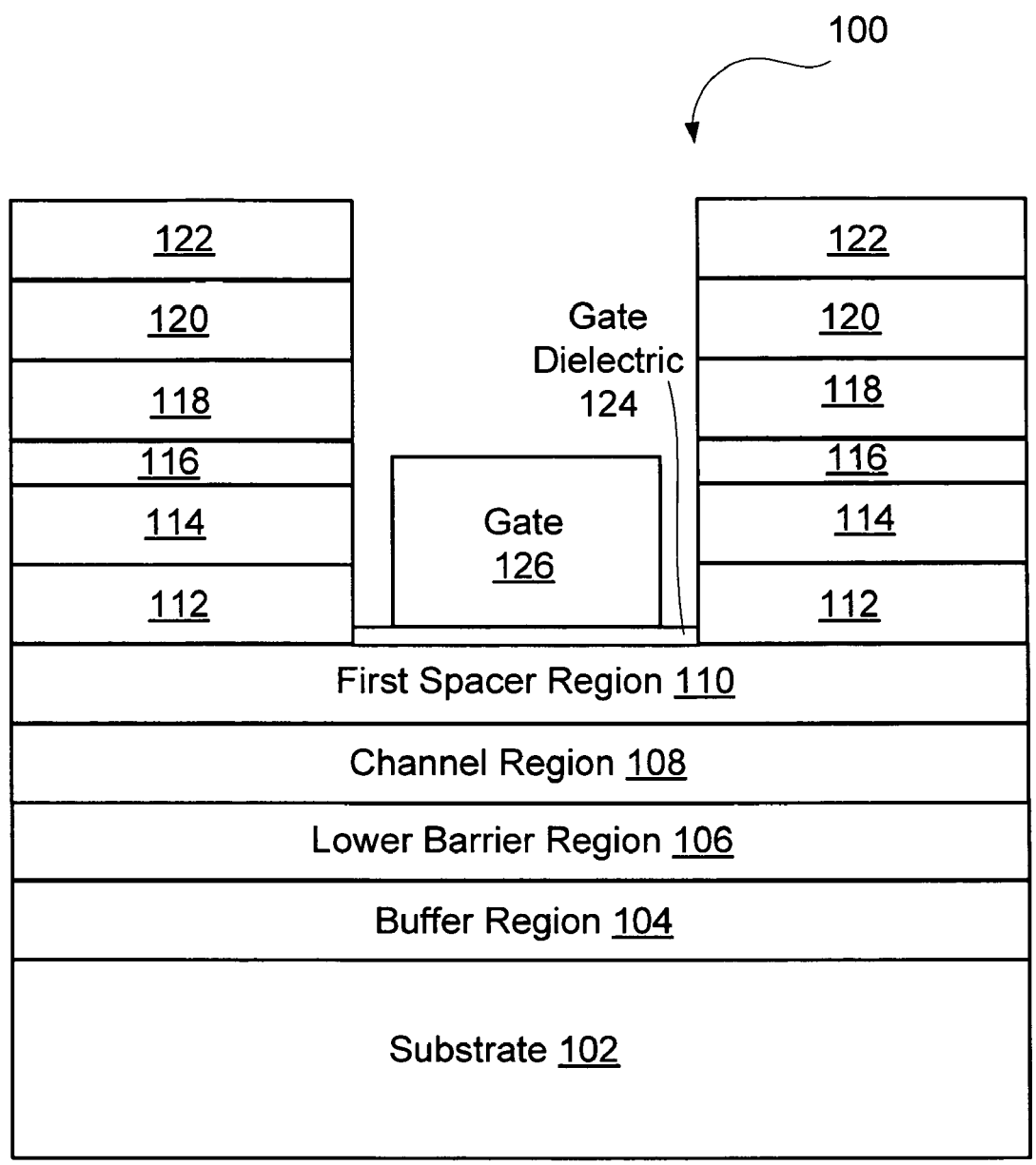
FIG. 1 is a cross sectional side view that illustrates a group III-V material quantum well transistor device.

FIG. 1 is a cross sectional side view that illustrates a group III-V material quantum well transistor device 100 with multiple spacer regions 110, 112, 114 above a channel region 108, according to one embodiment of the present invention. Such a device 100 with multiple spacer regions 110, 112, 114 allows the device 100 to have desired strain, insulator thickness, and carrier confinement, as well as allowing a high dielectric constant value (high-k) gate dielectric material to be in contact with a compatible material.

In the illustrated embodiment, the device 100 includes a substrate 102, which may be any material or materials on which the device 100 may be made. In some embodiments the substrate 102 may be a substantially single-crystal silicon material, a substantially single-crystal silicon material that is doped, a multi-crystal or multi-layer substrate 102. The substrate 102 may not comprise silicon in some embodiments, but may instead comprise a different substrate material, such as a GaAs or InP. The substrate 102 may include one or more material(s), device(s), or layer(s), or may be a single material without multiple layers.

There is a buffer region 104 on the substrate 102 in the illustrated embodiment. The buffer region 104 may function to accommodate for a lattice mismatch between the substrate 102 and regions above the buffer region 104 and to confine lattice dislocations and defects. There is a lower barrier region 106 on the buffer region 104, a channel region 108 on the lower barrier region 106, and a first spacer region 110 on the channel region 108 in the illustrated embodiment.

There is a gate dielectric 124 on the first spacer region 110 and a gate 126 on the gate dielectric 124 in the illustrated embodiment. The gate dielectric 124 may comprise a material with a high dielectric constant (high-k dielectric). Adjacent the gate dielectric 124 and gate 126 are additional regions that are not beneath the gate dielectric 124 and gate 126. In the illustrated embodiment, these additional regions include a second spacer region 112 on the first spacer region 110, a third spacer region 114 on the second spacer region 112, a doped region 116 on the third spacer region 114, an upper barrier region 118 on the doped region 116, an etch stop region 120 on the upper barrier region 118, and a contact region 122 on the etch stop region 120. These additional regions 112-122 may be considered a contact stack, with a contact stack being shown on either side of the gate dielectric 124 and gate 126 in FIG. 1.

Having multiple spacer regions allows the high-k gate dielectric 124 material to be in direct contact with a spacer region 110 comprising a material compatible with the high-k material of the gate dielectric 124, while other materials appropriate for use in the contact stack are used for the spacer regions in the contact stack. For example, the gate dielectric 124 may be directly on a first spacer region 110 that comprises a material that is compatible with the gate dielectric 124 (such as a high k gate dielectric 124 on a first spacer region 110 comprising InGaAs) while one or more other spacer regions 112 and/or 114 comprise other materials appropriate for the contact stacks (such as InAlAs).

FIGS. 2 through 18 are cross sectional side views that illustrate how the device 100 may be made, and provide additional details about embodiments of the invention.

Figure 2:
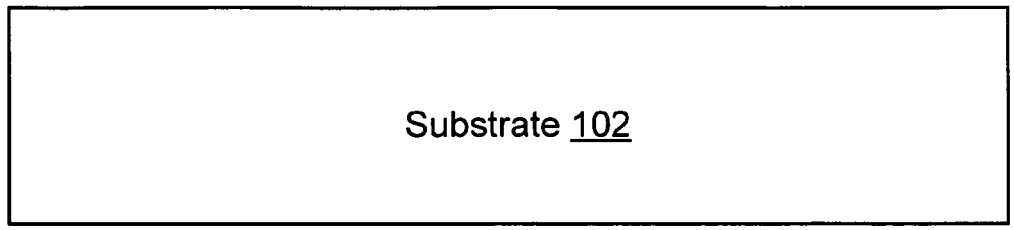
FIG. 2 is a cross sectional side view that illustrates the substrate.

FIG. 2 is a cross sectional side view that illustrates the substrate 102, according to one embodiment of the invention. The substrate 102 may comprise high-resistivity p-type or n-type vicinal silicon material having regular arrays of double-stepped (100) terraces across the substrate surface in some embodiments. A vicinal surface may be prepared by offcutting the substrate 102 from an ingot. In some embodiments, the (100) substrate surface is offcut at an angle between 2 and 8 degrees towards the [110] direction. In a particular embodiment, the (100) substrate surface is offcut at an angle of about 4 degrees towards the [110] direction. A vicinal surface is a higher order crystal plane of the silicon substrate 102, such as, but not limited to the (211), (511), (013), (711) planes.

The substrate 102 surface on which the device 100 is to be formed may have a resistance between about 1 ohm and about 50,000 ohms per centimeter. The high resistivity may be achieved by a low dopant concentration, lower than about $10^{16}$ carriers/cm$^3$. In other embodiments, the substrate 102 may have different resistivities or the resistance may be achieved by other methods.

In some embodiments the substrate 102 may be a substantially single-crystal silicon material, a substantially single-crystal silicon material that is doped, a multi-crystal or multi-layer substrate 102. In various embodiments, the substrate 102 could comprise germanium, germanium on silicon, or could be a silicon-on-insulator substrate 102. The substrate 102 may not comprise silicon in some embodiments, but may instead comprise a different material, such as a different semiconductor or a group III-V material such as GaAs or InP. The substrate 102 may include one or more material(s), device(s), or layer(s), or may be a single material without multiple layers.

Figure 3:
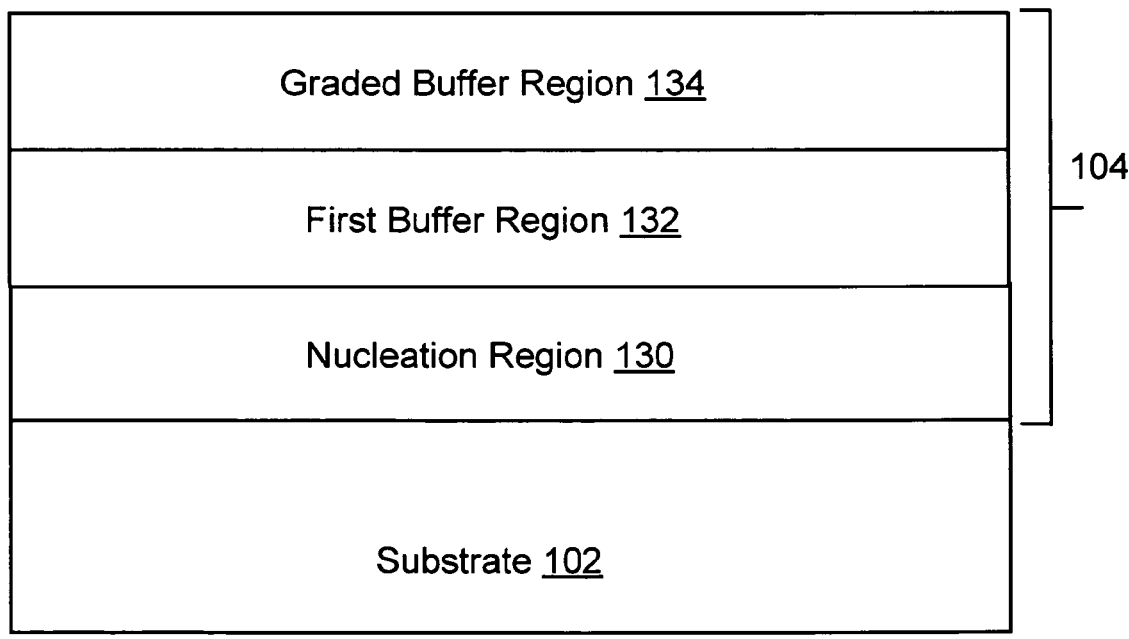
FIG. 3 is a cross sectional side view that illustrates a buffer region that is formed on the substrate.

FIG. 3 is a cross sectional side view that illustrates a buffer region 104 that is formed on the substrate 102 in one embodiment. The buffer region 104 may function to accommodate for a lattice mismatch between the substrate 102 and regions above the buffer region 104 and to confine lattice dislocations and defects. In the illustrated embodiment, the buffer region 104 has multiple regions: a nucleation region 130, a first buffer region 132, and a graded buffer region 134, although in other embodiments the buffer region 104 may have different numbers of regions or simply be a single region.

The nucleation region 130 comprises gallium arsenide in one embodiment, although other materials such as GaSb or AlSb may be used in other embodiments. (Note that as used herein, when materials designated by their elements without subscripts, these designations encompass any mix of percentages of the elements. For example, "InGaAs" encompasses $In_xGa_{1-x}As$, with x ranging between zero (GaAs) and one (InAs). Similarly, InAlAs encompasses $In_{0.52}Al_{0.48}As$.) It is formed by molecular beam epitaxy (MBE), migration enhanced epitaxy (MEE), metal-organic chemical vapor deposition (MOCVD), atomic layer epitaxy (ALE), chemical beam epitaxy (CBE), or another suitable method. It may be annealed after formation to reduce dislocations. It has a thickness of less than about 1000 angstrom in some embodiments, a thickness of less than about 500 angstroms in some other embodiments. In one embodiment, the nucleation region 130 has a thickness of about 300 angstroms. In embodiments where the substrate 102 is a vicinal silicon material, the nucleation region 130 may be made sufficiently thick to fill all the terraces of the silicon substrate 102. In an alternative embodiment, other suitable nucleation region 130 materials or thicknesses may be used, or the nucleation region 130 may be omitted.

On the nucleation region 130 is a first buffer region 132 in the illustrated embodiment. In an embodiment, the first buffer region 132 comprises a GaAs material, although other materials, such as InAlAs, AlSb, or other materials may be used. In an embodiment, the first buffer region 132 consists substantially the same material as the nucleation region 130. The buffer region 132 may also be formed by molecular beam epitaxy (MBE), migration enhanced epitaxy (MEE), metal-organic chemical vapor deposition (MOCVD), atomic layer epitaxy (ALE), chemical beam epitaxy (CBE), or another suitable method. The first buffer region 132 may have a thickness of less than one micron, between 0.3 microns and one micron, about 0.3 micron, or another thickness in various embodiments.

The first buffer region 132 may be formed by the same process used to form the nucleation region 130 in some embodiments. In such an embodiment, the growth of the first buffer layer 108 may be performed at a higher temperature than that used for the nucleation layer 104. While first buffer region 132 may be considered and is shown as a separate region than nucleation region 130, both regions 130, 132 may be considered buffers, with region 132 thickening the III-V buffer region started by nucleation region 130, and gliding dislocations. The film quality of region 132 may be superior to that of the nucleation region 132 because it may be formed at a higher growth temperature. Also, during the formation of region 132, the flux rate can be relatively high because the polar nucleation region 130 may eliminate danger of anti-phase domains (APD) formation.

In the illustrated embodiment, there is a graded buffer region 134 on the first buffer region 132. In the illustrated embodiment, the graded buffer region 134 comprises indium aluminum arsenide $In_xAl_{1-x}As$, with x ranging between zero (or another selected starting amount) and the amount of In desired in the bottom barrier region, although the graded buffer region 134 may comprise other materials and may be doped. For example, the graded buffer region 134 may comprise AlAs adjacent the first buffer region 132 (thus, x=0), with increasing amounts of In present (although not necessarily at a linear increase rate) higher in the graded buffer region 134 so that the graded buffer region 134 comprises $In_{0.52}Al_{0.48}As$ adjacent the bottom bather region 106. In some embodiments, the top of the graded buffer region 134 comprises $In_xAl_{1-x}As$, with x being between 0.52 and 0.70. The graded buffer region 134 has a thickness of less than about 5 microns in an embodiment, less than about 1 micron in another embodiment, about 0.8 microns in another embodiment, and about 0.3 microns in yet another embodiment. In other embodiments, it may have sufficient thickness that most defects present at its bottom surface are not present at its top surface. Any suitable method may be used to form the graded buffer region 134.

Note that some embodiments may lack a nucleation region 130, a buffer region 132 and/or graded buffer region 134. For example, in embodiments where the substrate 102 comprises a group III-V material, the device 100 may lack nucleation region 130, buffer region 132 and/or graded buffer region 134.

Figure 4:
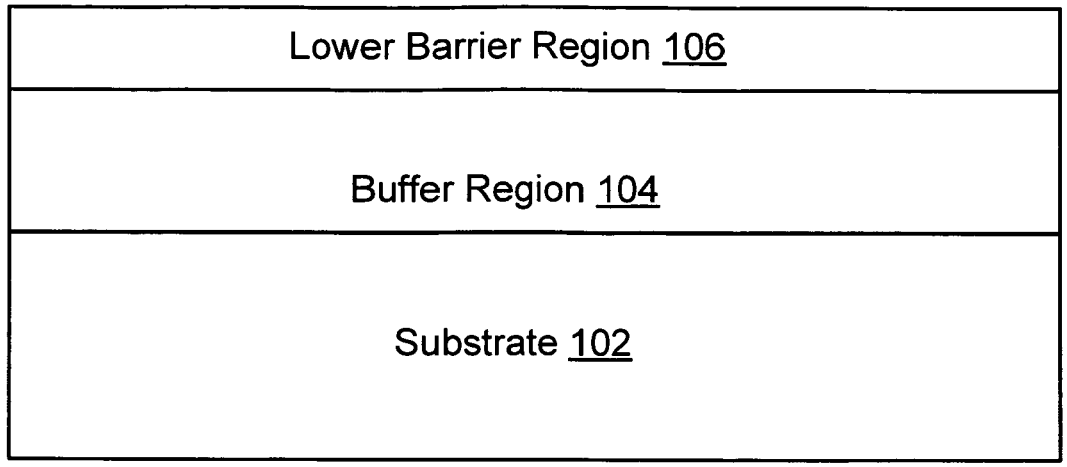
FIG. 4 is a cross sectional side view that illustrates the lower barrier region on the buffer region.

FIG. 4 is a cross sectional side view that illustrates the lower barrier region 106 on the buffer region 104, according to one embodiment. The lower barrier region 106 comprises InAlAs in the illustrated embodiment, although in other embodiments it may comprise other materials such as InAlSb or InP (note that various materials similar to this may be used in other regions of the device 100 such as the spacer regions and barrier regions). In embodiments where the lower barrier region 106 comprises InAlAs, it may comprise $In_xAl_{1-x}As$, with x between 0.52 and 0.70, although different compositions may be used in other embodiments. The lower barrier region 106 may be doped. The lower barrier region 106 may comprise a material with a higher band gap than the material of which the channel region 108 is comprised. Any suitable method, such as those listed as possible to form the buffer region 104, above, may be used to form the lower barrier region 106. In some embodiments, the lower barrier region 106 may have a thickness between about one micron and three microns or less. In an embodiment the lower barrier region 106 has a thickness less than about 500 nanometers, in another embodiment the lower barrier region 106 has a thickness of about 100 nanometers, and in other embodiments it may have yet other thicknesses.

Figure 5:
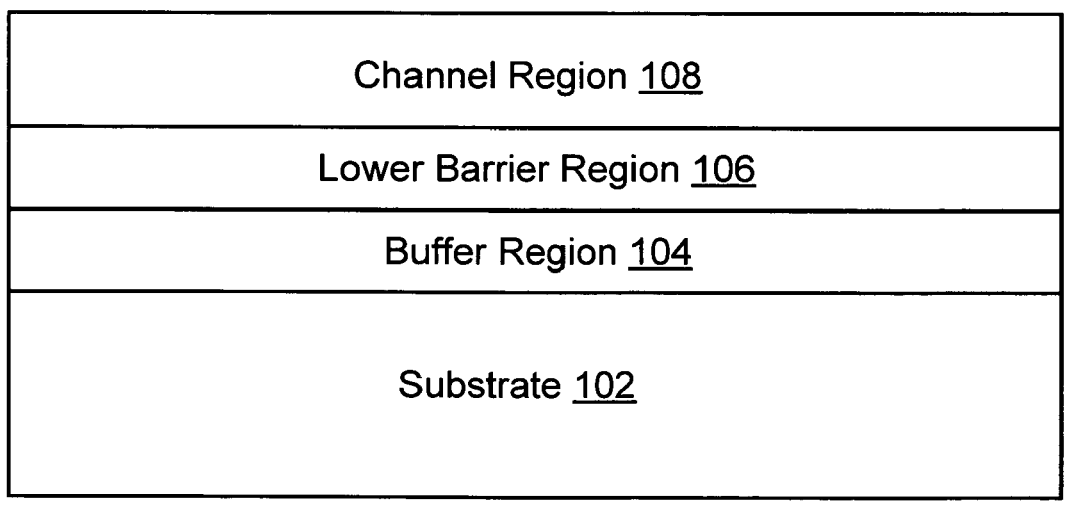
FIG. 5 is a cross sectional side view that illustrates a channel region.

FIG. 5 is a cross sectional side view that illustrates a channel region 108 on the lower barrier region 106, according to one embodiment. The channel region 108 may be a quantum well channel region 108. This quantum well channel region 108 comprises a group III-V material. A group III-V material is a material that has both a group III material and a group V material. For example, the group III-V material of the channel region 108 is InGaAs in the illustrated embodiment, although in other embodiments it may comprise other materials such as InSb or InAs. In an embodiment where the quantum well channel region 108 comprises InGaAs, the ratio of In to Ga may be selected to give the quantum well channel region 108 a rough lattice match to surrounding regions. For example, in an embodiment where the lower barrier region 106 comprises $In_{0.52}Al_{0.48}As$, the channel region 108 may comprise $In_{0.53}Ga_{0.47}As$. In other embodiments, the channel region 108 may comprise $In_xGa_{1-x}As$, with x being between about 0.53 and about 1.0 (in which case there is substantially no Ga), with lattice matching to the lower barrier region 106 not being a large consideration. In an embodiment, the channel region 108 comprises $In_{0.7}Ga_{0.3}As$. Other material ratios may be chosen to be used in the channel region 108 in other embodiments. The different ratio of In to Ga may be selected to provide a strain to the channel region 108. Any suitable method, such as those listed as possible to form the buffer region 104, above, may be used to form the quantum well channel region 108. In some embodiments, the quantum well channel region 108 may have a thickness between about 3 nanometers and twenty nanometers, although it may be less or more than that in other embodiments. In one embodiment, it has a thickness of about 10 nanometers.

Figure 6:
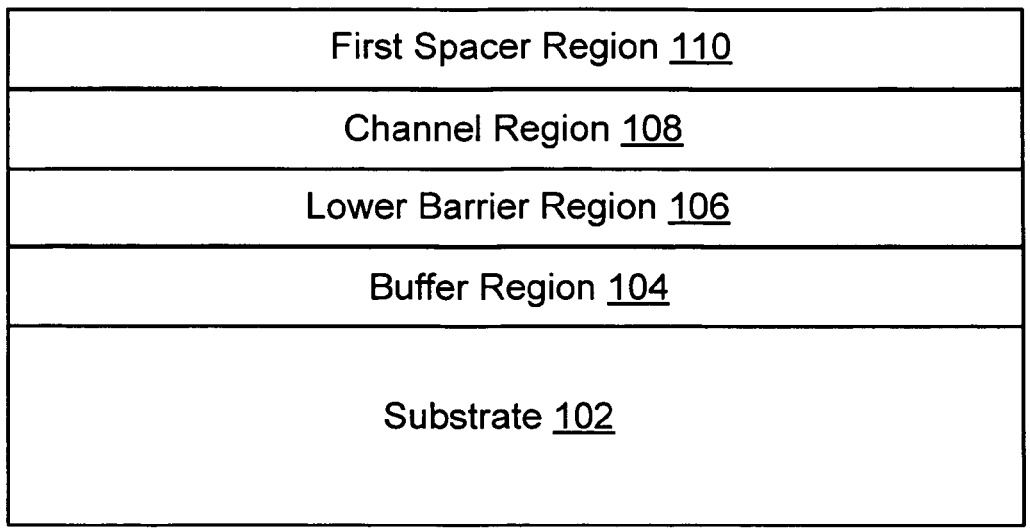
FIG. 6 is a cross sectional side view that illustrates a first spacer region.

FIG. 6 is a cross sectional side view that illustrates a first spacer region 110, which may also be referred to as a lower spacer region 110, on the channel region 108, according to one embodiment. The first spacer region 110 may comprise the same or a similar material as the channel region 108 in an embodiment, although in other embodiments it may comprise a different material. For example, in an embodiment where the channel region 108 comprises InGaAs, the first spacer region 110 may also comprise InGaAs. In some embodiments, the amounts of In, Ga, and As may be the same in the channel region 108 and first spacer region 110, while in other embodiments the amounts may be different, such as the channel region 108 comprising $In_{0.7}Ga_{0.3}As$ and the first spacer region 110 comprising $In_{0.53}Ga_{0.47}As$. In yet other embodiments, the channel region 108 and first spacer region 110 may comprise different materials altogether. The first spacer region 110 may be formed by any suitable method, and may be formed by the same method used to form the channel region 108. In one embodiment, the first spacer region 110 has a thickness less than about 5 nanometers. In another embodiment, the first spacer region 110 has a thickness of about 2 nanometers. In other embodiments, the first spacer 110 may have other thicknesses.

Figure 7:
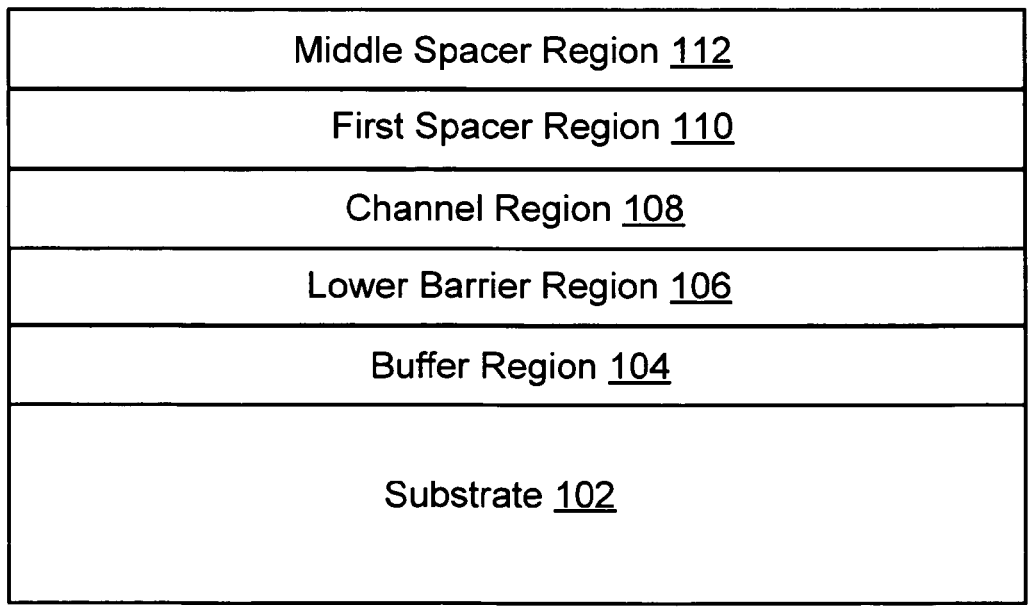
FIG. 7 is a cross sectional side view that illustrates a middle spacer region.

FIG. 7 is a cross sectional side view that illustrates a middle spacer region 112 on the first spacer region 110, according to one embodiment. In an embodiment, the middle spacer region 112 comprises a material that has a different etch rate in a given etchant than the etch rate of the first spacer region 110. For example, if the first spacer region 110 comprises InGaAs or InAlAs, the middle spacer region 112 may comprise InP or another material that etches much more quickly in a selected etchant than InGaAs or InAlAs does. In some embodiments, the selected etchant may not substantially affect the lower region at all after removing the upper region above the lower region. Other material combinations and etchants for the first spacer region 110 and middle spacer region 112 may also be used. The middle spacer region 112 is less than about 5 nanometers thick in an embodiment, is about 2 nanometers thick in another embodiment, and can be any other suitable thickness in other embodiments.

FIG. 8 is a cross sectional side view that illustrates an upper spacer region 114 on the middle spacer region 112, according to one embodiment. In an embodiment, the upper spacer region 114 comprises a material that has a different etch rate in a given etchant than the etch rate of the middle spacer region 112. For example, if the middle spacer region 112 comprises InP, the upper spacer region 114 may comprise InGaAs or InAlAs or another material that etches much more quickly in a selected etchant than InP does. In some embodiments, the selected etchant may not substantially affect the lower region at all after removing the upper region above the lower region. The material(s) that comprise the upper spacer region 114 are also selected based on the desired performance of the device 100 in some embodiments. In some embodiments, the upper spacer region 114 comprises $In_xAl_{1-x}As$, with x being between 0.52 and 0.70. Other material combinations for the upper spacer region 114 and middle spacer region 112 may also be used. The upper spacer region 114 is less than about 5 nanometers thick in an embodiment, is about 3 nanometers thick in another embodiment, and can be any other suitable thickness in other embodiments.

FIG. 9 is a cross sectional side view that illustrates a doped region 116 formed on the upper spacer region 114, according to one embodiment. The doped region 116 is doped according to the design of the device 100 and the targeted threshold voltage of the device 100 in an embodiment. Note that the term "doped region 116" as used herein may be a modulation doped region, a delta-doped region or another type of doped region in various embodiments.

The doped region 116 may comprise substantially the same material as the upper spacer region 114, with the addition of a dopant or dopants. For example, in an embodiment where the upper spacer region 114 comprises $In_{0.52}Al_{0.48}As$, the doped region 116 also comprises $In_{0.52}Al_{0.48}As$ with the addition of a dopant. The dopant used in the doped region 116 may be Te, Si, Be, or another dopant. There may be a dopant density in the doped region 116 of between about $1 \times 10^{11}/cm^2$ to about $8 \times 10^{12}/cm^2$ in some embodiments, although different dopant densities may be used. The density of dopants may be chosen based by the device 100 design and targeted threshold voltage of the device. In another embodiment, the doped region 116 may comprise Si that is doped. In an embodiment, the doped region 116, the upper spacer region 114 and/or other regions may be formed with a continuous growth process. For example, the upper spacer region 114 can comprise InAlAs formed in a chamber into which In, Al, and As are flowing and to form the doped region 116 the precursor flows are changed to result in the desired doped region 116. In other embodiments, different ways to form the regions may be used. In some embodiments, the doped region 116 may have a thickness of less than about 5 angstroms, although it may have different thicknesses in other embodiments.

Figure 10:
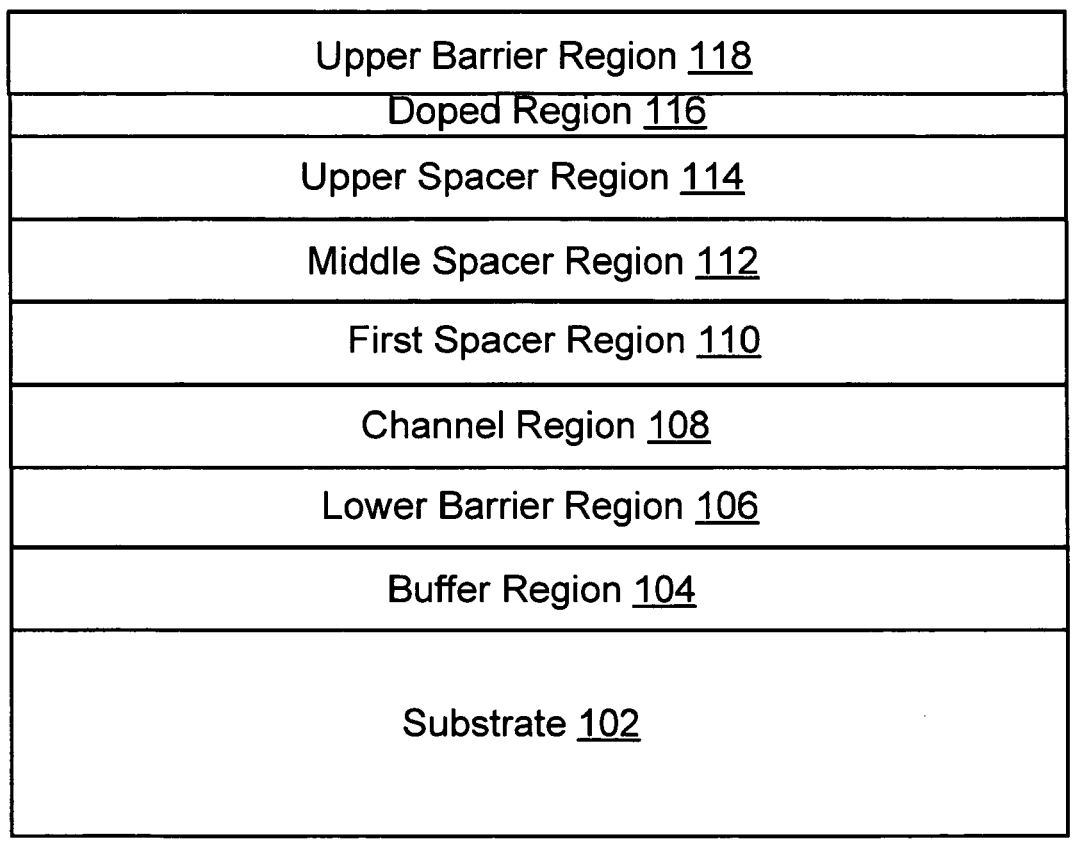
FIG. 10 is a cross sectional side view that illustrates an upper barrier region.

FIG. 10 is a cross sectional side view that illustrates an upper barrier region 118 on the doped region 116, according to one embodiment. The upper barrier region 118 comprises InAlAs in the illustrated embodiment, although in other embodiments it may comprise other materials. In an embodiment where the upper barrier region 118 comprises InAlAs, there may be a ratio of In to Al of about 52 to 48 ($In_{0.52}Al_{0.48}As$). Other ratios may be used in other embodiments. The upper barrier region 118 may comprise a material with a higher band gap than the material of which the quantum well channel region 108 is comprised. In an embodiment, the upper barrier region 118 comprises the same material as the lower barrier region 106 (e.g., if the lower barrier region 106 comprises $In_{0.60}Al_{0.40}As$, the upper barrier region 118 also comprises $In_{0.60}Al_{0.40}As$). In an embodiment, the upper barrier region 118 consists of substantially the same material as the lower barrier region 106. In other embodiments, the upper and lower barrier regions 118, 106 may comprise different materials. In some embodiments, the upper barrier region 118 consists of substantially the same material as the upper spacer region 114. Any suitable method, such as those listed as possible to form the buffer region 104, above, may be used to form the upper barrier region 118. In some embodiments, the upper barrier region 118 may be very thin, such as less than fifty nanometers. In an embodiment, the upper barrier region 118 may have a thickness of as small as about 3 nanometers or less, although it may have different thicknesses that are greater or less. This thickness may be chosen based on the targeted threshold voltage for the device 100.

FIG. 11 is a cross sectional side view that illustrates an etch stop region 120 formed on the upper barrier region 118, according to one embodiment. In an embodiment, the etch stop region 120 may comprise a material that has a different etch rate in a given etchant than the etch rate of the upper barrier region 118. For example, if the upper barrier region 118 comprises InGaAs or InAlAs, the etch stop region 120 may comprise InP or another material that etches much more quickly in a selected etchant (such as HCl) than InGaAs or InAlAs does. In some embodiments, the selected etchant may not substantially affect the lower region at all after removing the upper region above the lower region. Similarly, the etch stop region 120 comprises a material that has a much slower etch rate in a second given etchant than the etch rate of a material directly above the etch stop region 120. For example, if the material directly above the etch stop region 120 comprises InGaAs or InAlAs and the second given etchant is citric acid, the etch stop region 120 may comprise InP, which is etched significantly slower than InGaAs or InAlAs in citric acid. Other material combinations and etchants for the upper barrier region 118 and etch stop region 120 may also be used. The etch stop region 120 can have various thicknesses in various embodiments. In an embodiment, the etch stop region 120 has a thickness less than about 10 nanometers thick in an embodiment, has a thickness between 10 nanometers and 5 nanometers in another embodiment, has a thickness less than about 5 nanometers thick in yet another embodiment, and can be any other suitable thickness to act as an etch stop in other embodiments.

FIG. 12 is a cross sectional side view that illustrates a contact region 122 on the etch stop region 120, according to one embodiment. In some embodiments, the contact region 122 comprises $In_xGa_{1-x}As$. In an embodiment x is 0.53, although it may be different values in different embodiments. In some embodiments, the contact region 122 is graded to comprise a gradually differing material between the top and bottom of the contact region 122. For example, the contact region 122 in one embodiment comprises $In_xGa_{1-x}As$, with x=0.53 at the bottom of the region 122, with less Ga being present further up in the contact region 122, until x=1 at the top of the region 122. Different values can be used for x at the top and bottom of the region 122 and different materials such as InAlAs where the amount of In and Al may graded or not graded in various embodiments, or other suitable contact materials may be used.

As discussed above, in an embodiment, the contact region 122 comprises a material that has a different etch rate in a given etchant than the etch rate of the etch stop region 120. For example, if the etch stop region 120 comprises InP, the contact region 122 may comprise InGaAs or InAlAs or another material that etches much more quickly in a selected etchant (such as citric acid) than InP does. In some embodiments, the selected etchant may not substantially affect the lower region at all after removing the upper region above the lower region. Other material combinations for the contact region 122 and etch stop region 120 as well as different etchants may also be used. The contact region 122 is less than about 25 nanometers thick in an embodiment, is about 20 nanometers thick in another embodiment, and can be any other suitable thickness in other embodiments.

Figure 13:
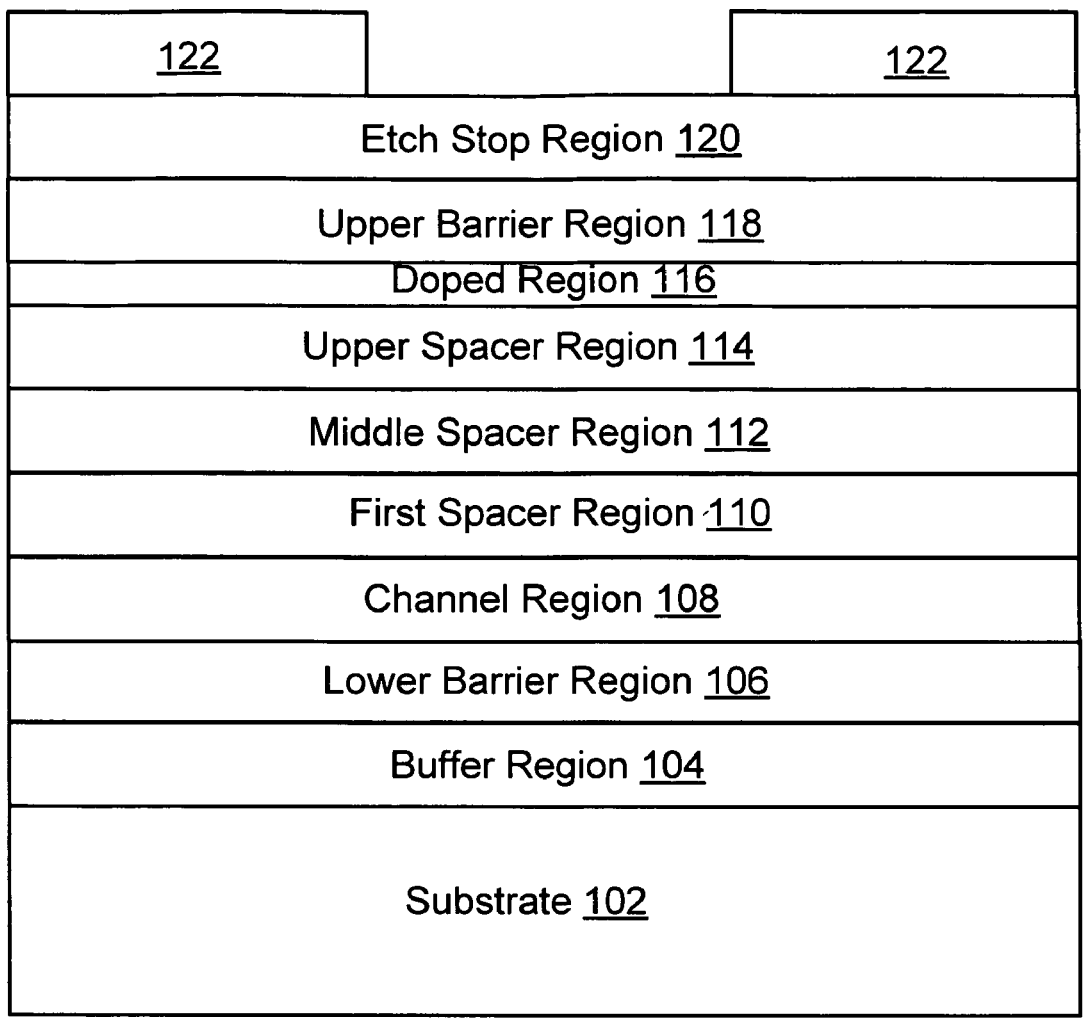
FIG. 13 is a cross sectional side view that illustrates the contact region after a portion of the contact region has been removed.

FIG. 13 is a cross sectional side view that illustrates the contact region 122 after a portion of the contact region 122 has been removed, according to one embodiment. In an embodiment, the portion of the contact region 122 is removed with an etchant that removes the material of the contact region 122 at a rate faster than the etchant removes material of the etch stop region 120, allowing the etch stop region 120 to act as an etch stop. In an embodiment, the etchant removes the material of the contact region 122 at least four times faster than it removes the material of the etch stop region 120. In an embodiment, the etch stop region 120 is substantially unaffected by the etchant used to remove the contact region 122. In an embodiment, the contact region 122 comprises InGaAs, the etch stop region 120 comprises InP, and the etchant comprises citric acid, although other combinations can be used in other embodiments.

Figure 14:
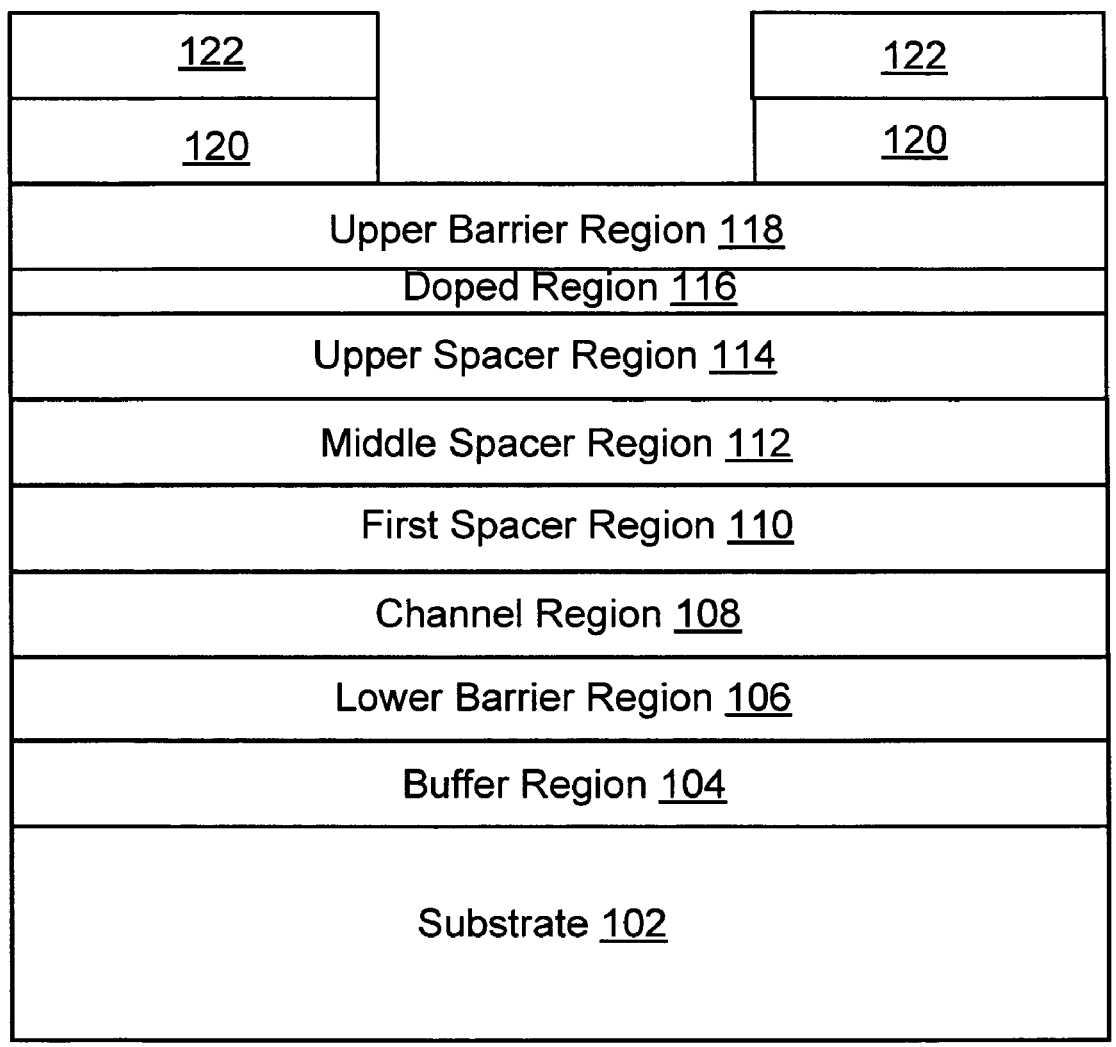
FIG. 14 is a cross sectional side view that illustrates the etch stop region after a portion of the etch stop region has been removed.

FIG. 14 is a cross sectional side view that illustrates the etch stop region 120 after a portion of the etch stop region 120 has been removed, according to one embodiment. In an embodiment, the portion of the etch stop region 120 is removed with an etchant that removes the material of the etch stop region 120 at a rate faster than the etchant removes material of the upper barrier region 118, so the etching stops at the upper barrier region 118. In an embodiment, the etchant removes the material of the etch stop region 120 at least four times faster than it removes the material of the upper barrier region 118. In an embodiment, the upper barrier region 118 is substantially unaffected by the etchant used to remove the etch stop region 120. In an embodiment, the etch stop region 120 comprises InP, the upper barrier region 118 comprises InAlAs, and the etchant comprises HCl, although other combinations such as a timed dry etch can be used in other embodiments.

Figure 15:
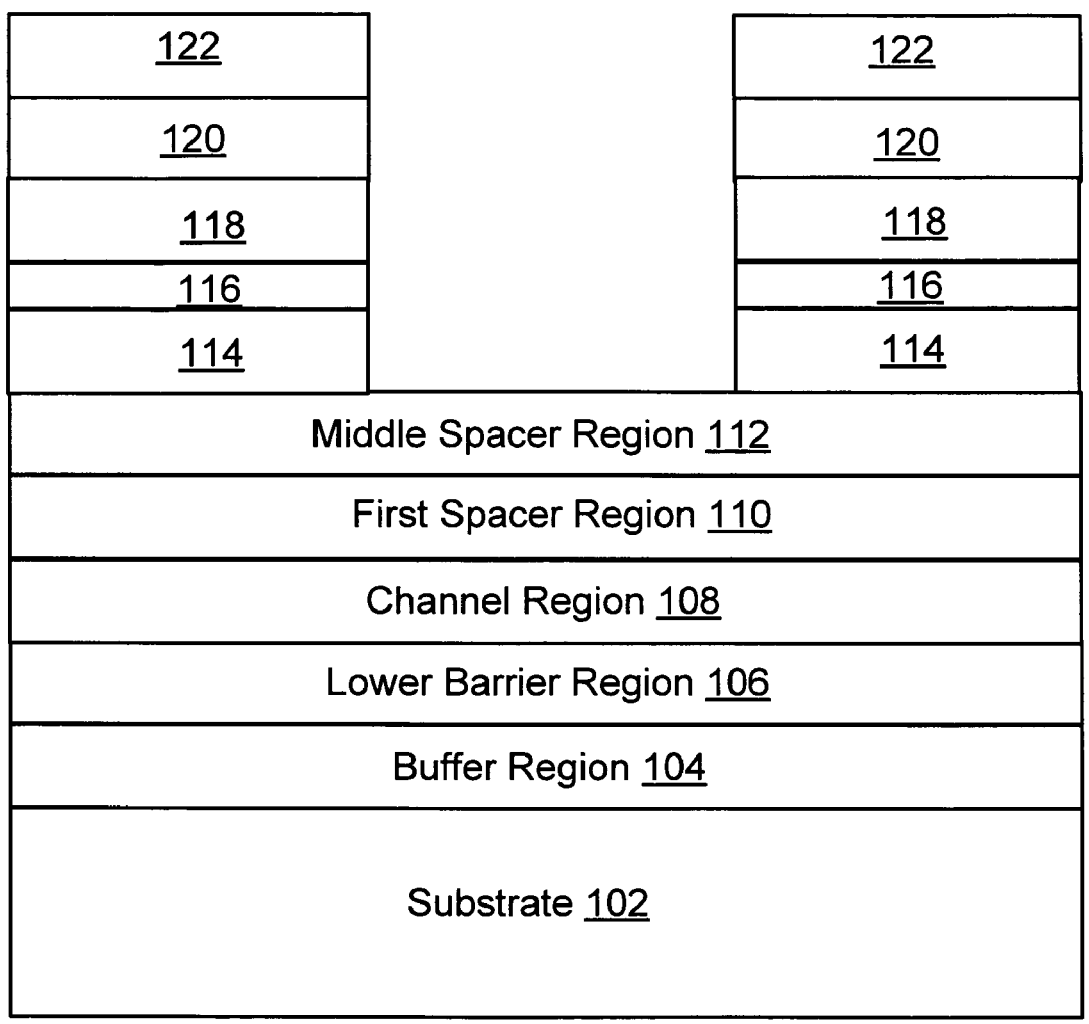
FIG. 15 is a cross sectional side view that illustrates the upper barrier region, doped region, and upper spacer region, after portions of those regions have been removed to expose the middle spacer region.

FIG. 15 is a cross sectional side view that illustrates the upper barrier region 118, doped region 116, and upper spacer region 114, after portions of those regions have been removed to expose the middle spacer region 112, according to one embodiment. In an embodiment, the portions of the upper barrier region 118, doped region 116, and upper spacer region 114 are removed with an etchant that removes the material of the upper barrier region 118, doped region 116, and upper spacer region 114 at a rate faster than the etchant removes material of the middle spacer region 112, so the etching stops at the middle spacer region 112. In an embodiment, the etchant removes the material of the upper barrier region 118, doped region 116, and upper spacer region 114 at least four times faster than it removes the material of the middle spacer region 112. In an embodiment, the middle spacer region 112 is substantially unaffected by the etchant used to remove the upper barrier region 118, doped region 116, and upper spacer region 114. In an embodiment, the middle spacer region 112 comprises InP, while the upper barrier region 118, doped region 116, and upper spacer region 114 comprise InAlAs, and the etchant comprises citric acid, although other combinations such as a timed dry etch can be used in other embodiments.

Figure 16:
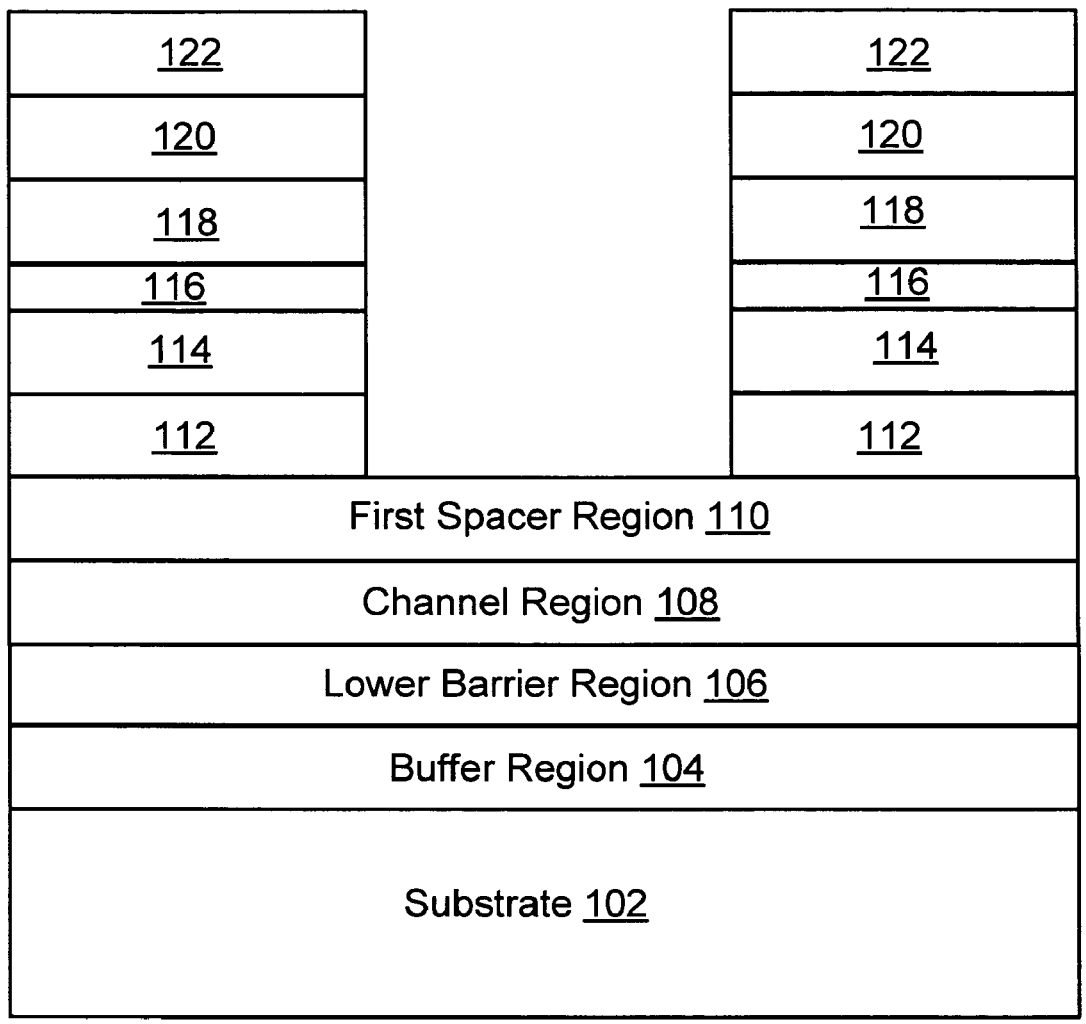
FIG. 16 is a cross sectional side view that illustrates the middle spacer region after a portion of the middle spacer region has been removed.
Figure 18:
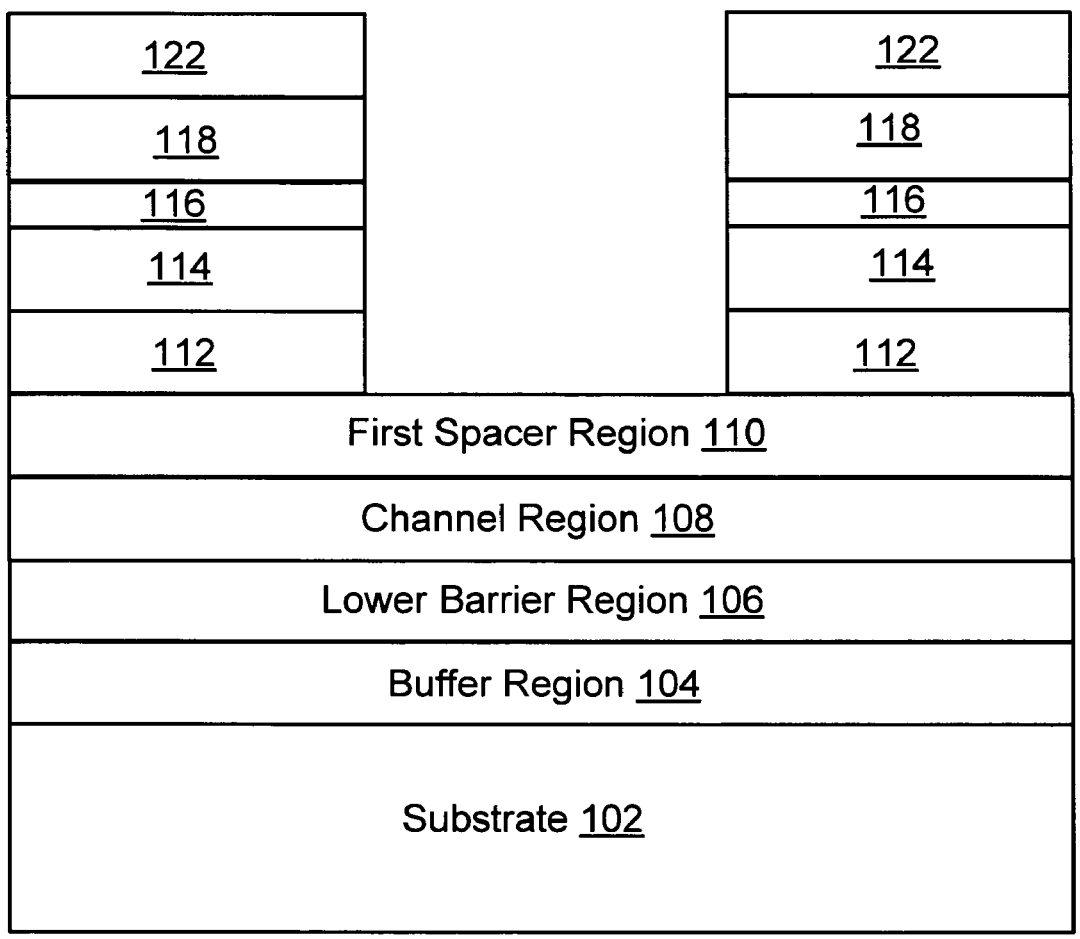

FIG. 16 is a cross sectional side view that illustrates the middle spacer region 112 after a portion of the middle spacer region 112 has been removed, according to one embodiment. In an embodiment, the portion of the middle spacer region 112 is removed with an etchant that removes the material of the middle spacer region 112 at a rate faster than the etchant removes material of the first spacer region 110, so the etching stops at the first spacer region 110. In an embodiment, the middle spacer region 112 comprises InP, the first spacer region 110 comprises InGaAs, and the etchant comprises HCl, although other combinations such as a timed dry etch can be used in other embodiments. In an embodiment, the etchant removes the material of the middle spacer region 112 at least four times faster than it removes the material of the first spacer region 110. In an embodiment, the first spacer region 110 is substantially unaffected by the etchant used to remove the middle spacer region 112.

The gate dielectric 124 can then be formed directly on the first spacer region 110, with the gate 126 being formed on the gate dielectric 124, as is shown in FIG. 1. Having the spacer regions 110, 112, 114, upper barrier region 118, etch stop region 120, and contact region 122 with their various materials and etch selectivity allows easy removal of all but the first spacer region 110 so that the gate dielectric 124 can be formed in close proximity to the channel region 108 and on a first spacer region 110 that comprises a material compatible with the gate dielectric 124.

The gate dielectric 124 may comprise a high-k dielectric material such as $Al_2O_3$, although other materials such as $La_2O_3$, $HfO_2$, $ZrO_2$, $TaO_5$, or ternary complexes such as $LaAl_xO_y$, $Hf_xZr_yO_z$ or other materials may be used in other embodiments. In embodiments where the gate dielectric 124 is $Al_2O_3$, the $Al_2O_3$ may be deposited using trimethylaluminum (TMA) and water precursors with and ALD process in one embodiment, although other methods to form it may be used. In an embodiment, the gate dielectric 124 has a thickness between about 0.7 nanometers and 5 nanometers, in another embodiment the gate dielectric has a thickness less than 5 nanometers, and in other embodiments the gate dielectric 124 may have different thicknesses.

The gate 126 may comprise a metal-containing material such as Pt/Au, Ti/Au, Ti/Pt/Au, or another material or materials. In various embodiments, the material or materials of the gate 126 may be chosen to provide a desired workfunction. Source and drain regions may be formed on the contact regions 122. In one embodiment, the source and drain regions may comprise NiGeAu. In another embodiment, the source and drain regions may comprise TiPtAu. In other embodiments, the source and drain regions may comprise another material or materials.

FIG. 17 is a cross sectional side view that illustrates an alternative embodiment to that illustrated in FIG. 12. The embodiment illustrated in FIG. 17 lacks the etch stop region 120 that is present in the embodiment in FIG. 12. Rather than having an etchant that etches the contact region 122 at a rate much greater than the etch stop region 120, a timed removal process may be used so that a portion of the contact region 122 is removed without removing a significant portion of the upper barrier region 118. In another embodiment, the same material removal process is used to remove portions of regions 122, 118, 116, and 114. For example, if contact region 122 comprises InGaAs, and upper barrier region 118, doped region 116, and upper spacer region 114 comprise InAlAs, a citric acid etchant can remove portions of all those regions, while a middle spacer region 112 that comprises InP will remain substantially unaffected by the etchant and act as an etch stop. A portion of the middle spacer region 112 can then be removed with a different etchant that does not substantially affect the first spacer region 110, which may for example comprise InGaAs. The results of such material removal can be seen in FIG. 18. This can allow the gate dielectric 124 to be placed close to the channel region 108 and on a compatible first spacer region 110 material, while retaining an appropriate upper spacer region 114 material in the contact stacks.

Figure 20:
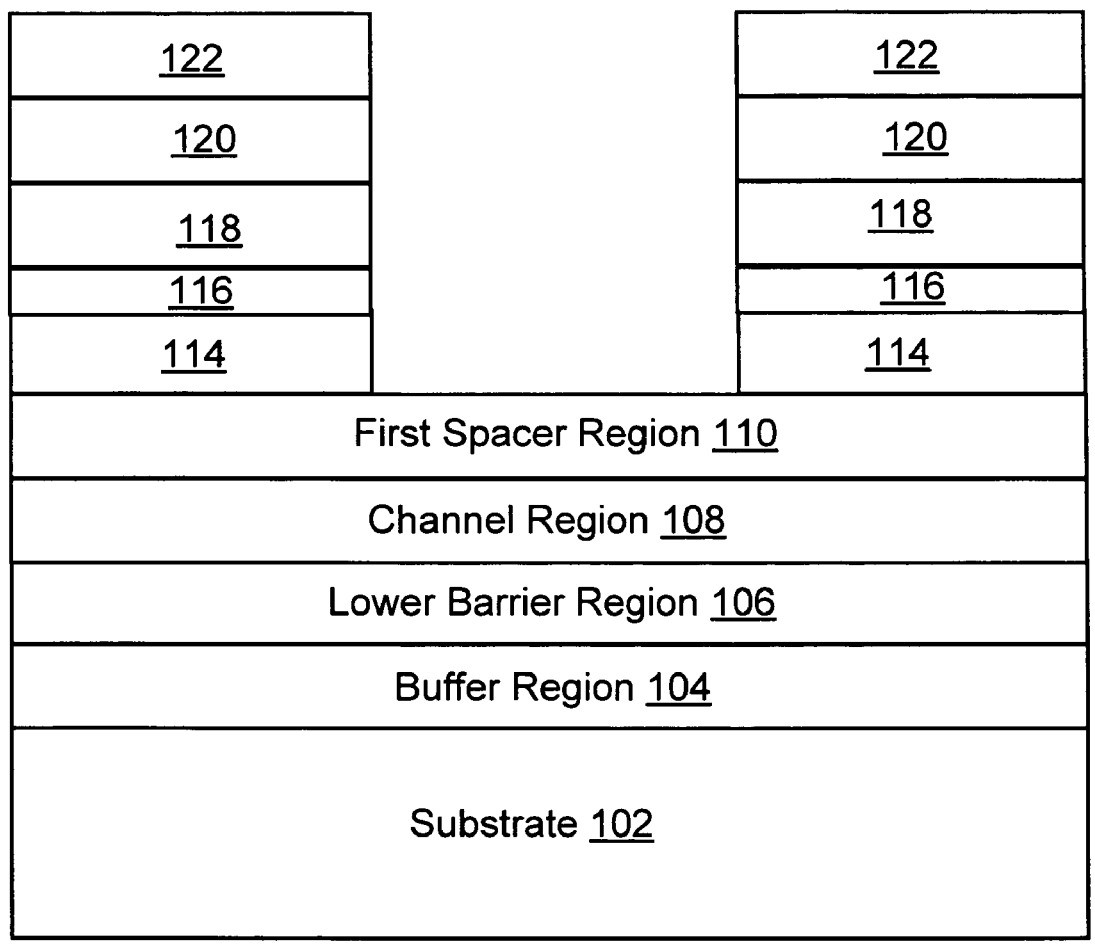

FIG. 19 is a cross sectional side view that illustrates another alternative embodiment to that illustrated in FIG. 12. The embodiment illustrated in FIG. 19 lacks the middle spacer region 112 that is present in the embodiment in FIG. 12. Rather than having an etchant that etches the upper spacer region 114 at a rate much greater than the middle spacer region 112, a timed removal process may be used so that a portion of the upper spacer region 114 is removed without removing a significant portion of the first spacer region 110. The results of such material removal can be seen in FIG. 20. This embodiment can still allow the gate dielectric 124 to be placed close to the channel region 108 and on a compatible first spacer region 110 material, while retaining an appropriate upper spacer region 114 material in the contact stacks.

Yet other embodiments may lack both the etch stop region 120 and the middle spacer region 112. A timed or other process may be used to remove material above the spacer region 110.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not necessarily indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method to form a group III-V material transistor, comprising:
    forming a lower barrier region comprising InAlAs;
    forming a quantum well channel region comprising InGaAs on top of the lower barrier region;
    forming a first spacer region comprising InGaAs on top of the quantum well channel region;
    forming a second spacer region comprising InAlAs on top of the first spacer region;
    forming a doped region on top of the second spacer region;
    forming an upper barrier region comprising InAlAs on top of the doped region;
    removing a portion of the upper barrier region, a portion of the doped region, and a portion of the second spacer region to expose a portion of the first spacer region; and
    forming a gate dielectric on the first spacer region after exposing the first spacer region.

2. The method of claim 1, wherein the gate dielectric comprises a high-k material and further comprising forming a gate electrode on the gate dielectric.

3. The method of claim 1, further comprising forming a third spacer region comprising InP on top of the first spacer region, the second spacer region being formed on top of the third spacer region, wherein removing the portion of the upper barrier region, the portion of the doped region, and the portion of the second spacer region to expose the first spacer region comprises:
    using a first etchant that removes the second spacer region at least four times faster than the third spacer region to remove the portion of the second spacer region and expose a portion of the third spacer region; and
    using a second etchant that removes the third spacer region at least four times faster than the first spacer region to remove the portion of the third spacer region to expose the portion of the first spacer region.

4. The method of claim 1, further comprising forming a contact region comprising InGaAs on top of the upper barrier region.

5. The method of claim 4, further comprising forming an etch stop region comprising InP on the upper barrier region, the contact region being formed on the etch stop region.

6. A device comprising:
    a lower barrier region comprising InAlAs;
    a quantum well channel region comprising InGaAs on top of the lower barrier region;
    a first spacer region comprising InGaAs on top of the quantum well channel region;
    a gate dielectric on the first spacer region;
    a gate electrode on top of the first spacer region, the gate electrode having a first side and a second side opposite the first side;
    a second spacer region comprising InAlAs on top of the first spacer region; and
    wherein the gate dielectric is not on the second spacer region.

7. The device of claim 6, wherein there is a trench through the second spacer region and the gate dielectric is within the trench.

8. The device of claim 6, further comprising a doped region on top of the second spacer region.

9. The device of claim 8, further comprising an upper barrier region comprising InAlAs on top of the second spacer region.

10. The device of claim 9, wherein there is a trench through the second spacer region, doped region, and upper barrier region, and the gate dielectric is within the trench.

11. The device of claim 9, further comprising a third spacer region comprising InP between the first spacer region and the second spacer region.

12. The device of claim 9, wherein the gate electrode is not directly above the second spacer region, the third spacer region, the doped region, or the upper barrier region.

13. The device of claim 6, wherein the gate electrode comprises a metal.

14. The device of claim 6, wherein the gate dielectric region comprises a high-k material.

15. The device of claim 6, further comprising a contact region on the upper barrier region, the contact region comprising InGaAs.

16. The device of claim 6, wherein the first spacer region comprises $In_yGa_{1-y}As$, where y is less than 0.6 and the quantum well channel region comprises $In_xGa_{1-x}As$ where x is greater than 0.6.

17. A semiconductor device comprising:
    a recessed gate electrode on a gate dielectric, the gate dielectric comprising a material with a high-k value;
    a contact stack on either side of the recessed gate electrode and gate dielectric, the contact stack comprising:
        a second spacer region comprising InAlAs;
        a contact region comprising InGaAs on the second spacer region;
    wherein beneath the gate electrode, gate dielectric, and contact stack are:
        a bottom barrier region comprising InAlAs;
        a quantum well channel region comprising InGaAs; and
        a first spacer region comprising InGaAs.

18. The device of claim 17, wherein the contact stack further comprises a third spacer region comprising InP between the second spacer region and the first spacer region.

19. The device of claim 18, further comprising a doped region between the quantum well channel region and the first spacer region.

20. The device of claim 17, wherein the gate dielectric material is in direct contact with the first spacer region.

* * * * *